United States Patent [19]
Makino et al.

[11] 3,949,345
[45] Apr. 6, 1976

[54] MULTIPLE MAGNETORESISTANCE ELEMENT

[75] Inventors: Yoshimi Makino, Fujisawa; Akihisa Narimatsu, Naka; Masao Horie, Tachikawa, all of Japan

[73] Assignee: Sony Corporation, Tokyo, Japan

[22] Filed: Nov. 13, 1974

[21] Appl. No.: 523,339

[30] Foreign Application Priority Data
Nov. 17, 1973  Japan.............................. 48-129616

[52] U.S. Cl.............. 338/32 R; 323/94 H; 338/287; 338/308
[51] Int. Cl.².......................................... H01C 7/16
[58] Field of Search........ 338/32 R, 32 H, 283–285, 338/287, 308; 323/94 H; 324/45, 46; 340/174 EB

[56] References Cited
UNITED STATES PATENTS 3,331,045  7/1967  Weiss et al........................ 338/32 R
3,848,217  11/1974  Lazzari.............................. 338/32 R

*Primary Examiner*—C. L. Albritton
*Attorney, Agent, or Firm*—Hill, Gross, Simpson, Van Santen, Steadman, Chiara & Simpson

[57]     ABSTRACT

A multiple magnetoresistance element includes a first stripe group and a second stripe group which comprise a plurality of stripes electrically connected in series with each other and spaced from each other by a predetermined distance. The stripes are made of ferromagnetic material having an anisotropic effect of magnetoresistance and have a plurality of main current path portions.

The first stripe group and the second stripe group are electrically connected to each other and spaced from each other by a predetermined distance. An output terminal is connected to a connecting point of the first stripe group and the second stripe group. Current supply terminals are connected to ends of the first stripe group and the second stripe group.

7 Claims, 12 Drawing Figures

MULTIPLE MAGNETORESISTANCE ELEMENT

BACKGROUND OF THE INVENTION

1. Field of the Invention

This invention relates to a multiple magnetoresistance element and more particularly to a multiple magnetoresistance element having selectivity of wave length for periodic magnetic signals.

2. Description of the Prior Art

Hitherto, a multi-gap magnetic head is used as a detecting element having selectivity of wave length for periodic magnetic signals such as a magnetic scale. However, the multi-gap magnetic head is apt to be affected by change of temperature and external magnetic fields. Coil windings are required. Moreover, saturable cores are required for the multi-gap magnetic head, since it is of the magnetic flux responding type. Therefore, the apparatus using the multi-gap magnetic head has the disadvantage that it is complicated in construction and that it is expensive.

The selectivity of wave length means the function to detect selectively signals with specific frequencies from a composite signal with different frequency components. When the multi-gap magnetic heads detect the repeated magnetic signals which are recorded on the magnetic scale, the selectivity of wave length means the function to detect selectively signals with wave lengths twice, four times, six times . . . as long as the distance between the adjacent gaps of the multi-gap magnetic head, from the repeated magnetic signals.

SUMMARY OF THE INVENTION

An object of this invention is to provide a multiple magnetoresistance element which can detect magnetic flux and which is simple in construction.

Another object of this invention is to provide a multiple magnetoresistance element which is not affected by external magnetic fields.

A further object of this invention is to provide a multiple magnetoresistance element which is not affected by change of temperature.

A still further object of this invention is to provide a multiple magnetoresistance element which can be easily manufactured.

In accordance with an aspect of this invention, a multiple magnetoresistance element, comprises:

a. first and second magnetoresistance stripe groups formed of ferromagnetic material having an anisotropic effect of magnetoresistance, connected electrically in series with each other and spaced from each other by a predetermined distance, the first and second magnetoresistance stripe groups comprising a plurality of magnetoresistance stripes having main current path portions, connected electrically in series with each other and spaced from each other by a predetermined distance;

b. an output terminal connected to a connecting point of the first and second magnetoresistance stripe groups;

c. current supply terminals connected to ends of the first and second magnetoresistance stripe groups; and d. a power source connected to the current supply terminals.

The above, and other objects, features and advantages of the invention, will be apparent in the following detailed description of illustrative embodiments thereof which is to be read in connection with the accompanying drawings.

DESCRIPTION OF THE PREFERRED EMBODIMENTS

A magnetoresistance element with a novel construction was proposed in the Japanese patent application No. 79655/1973 filed on July 13, 1973, by this applicant.

First, the outline of the above-mentioned Japanese Patent Applications will be described.

Figure 1:
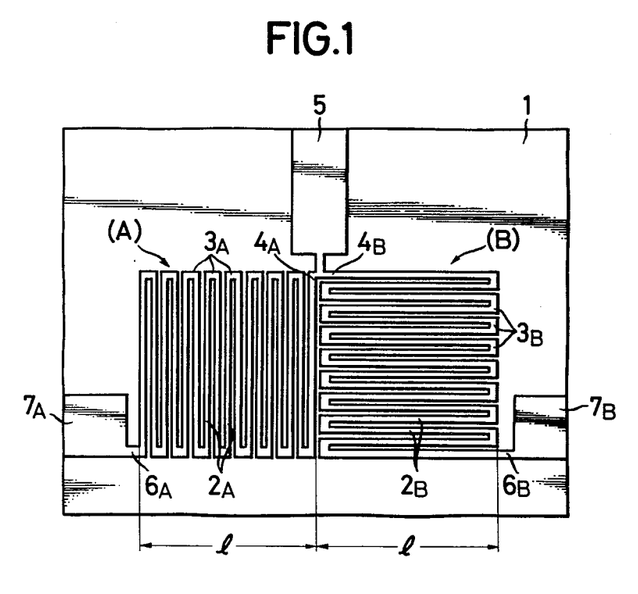
FIG. 1 is a plan view of a magnetoresistance element useful in explaining a multiple magnetoresistance element according to this invention, which will be detailedly described in the specification of the Japanese patent application No. 79655/1973.

FIG. 1 shows the construction of the magnetoresistance element. Films of stripes (A) and (B) formed of ferromagnetic material having an anisotropic effect of magnetoresistance, such as nickel-cobalt are formed on a base plate 1 formed of glass. The stripes (A) and (B) are deposited on the base plate 1 by the vacuum evaporation method. Or the stripes (A) and (B) are formed on the base plate 1 by the etching method, after the film of the ferromagnetic material was deposited on the whole surface of the base plate 1. The stripes (A) and (B) comprise a plurality of main current path portions 2A and 2B, and a plurality of connecting portions 3A and 3B. The main current path portions 2A are perpendicular to the main current path portions 2B. One end 4A of the last of the main current path portions 2A is connected to one end 4B of the first of the main current path portions 2B. Accordingly, the stripes (A) and (B) are connected in series with each other. An output terminal 5 is connected to a connecting point of the stripes (A) and (B). A current supply terminal 7A is connected to one end 6A of the first of the main current path portions 2A, and another current supply terminal 7B is connected to one end 6B of the last of the main current path portions 2B.

Figure 2:
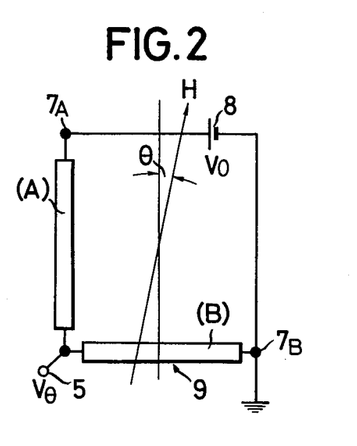
FIG. 2 is a schematic view illustrating a principle of the magnetoresistance element shown on FIG. 1.

Referring to FIG. 2, the current supply terminals 7A and 7B are connected to a power source 8. The one current supply terminal 7B is connected to the ground. Thus, a sensing circuit 9 for the direction of the magnetic field H can be obtained.

A magnetic field H sufficient to saturate the stripes (A) and (B) formed of ferromagnetic material, is applied to the stripes (A) and (B) at an angle $\theta$ to the longitudinal direction of the main current path portions 2A of the stripe (A). Resistances $\rho_A$ and $\rho_B$ of the stripes (A) and (B) will be represented by the following equations.

$$\rho_A = \rho_\perp \sin^2\theta + \rho_{//} \cos^2\theta \tag{1}$$

$$\rho_B = \rho_\perp \cos^2\theta + \rho_{//} \sin^2\theta \tag{2}$$

where $\rho_\perp$ is a resistance of the ferromagnetic stripe (A) or (B) when saturated with a magnetic field perpendicular to the current-flowing direction of the ferromagnetic stripe (A) or (B), and $\rho_{//}$ a resistance of the ferromagnetic stripe when saturated with a magnetic field parallel with the current-flowing direction of the ferromagnetic stripe (A) or (B).

A voltage $V_\theta$ at the output terminal 5 will be represented by $$V_\theta = \frac{\rho_B}{\rho_A + \rho_B} \cdot V_o \tag{3}$$

where $V_o$ is a voltage of the power source 8.

By substitution of the equations (1) and (2), $$V_\theta = \frac{V_o}{2} - \frac{\Delta\rho \cos 2\theta}{2(\rho_{//} + \rho_\perp)} \cdot V_o \tag{4}$$

where $\Delta\rho = \rho_{//} - \rho_\perp$.

In the equation (4), the first term represents a standard voltage $V_s (V_s = V_o/2)$, and the second term a change of the output voltage $\Delta V_\theta$.

The second term $\Delta V_\theta$ is converted into $$\Delta V_\theta = -\frac{\Delta\rho}{4\rho_o} \cdot \cos 2\theta \cdot V_o \tag{5}$$

where $2\rho_o = \rho_{//} + \rho_\perp$ and $\rho_o$ is a resistance of the ferromagnetic stripe (A) or (B) when no magnetic field is applied to the ferromagnetic stripe (A) or (B).

Figure 3:
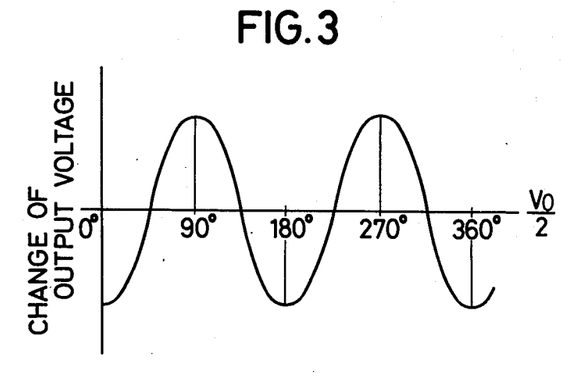
FIG. 3 shows the relationship between the change of the output voltage of the magnetoresistance element and the direction of the magnetic field applied to the magnetoresistance element.

As shown on FIG. 3, the change of the output voltage is minimum at the directions 0° and 180° of the magnetic fields H, and it is maximum at the directions 90° and 270° of the magnetic fields H. The change of the output voltage is sine-wave.

Figure 4:
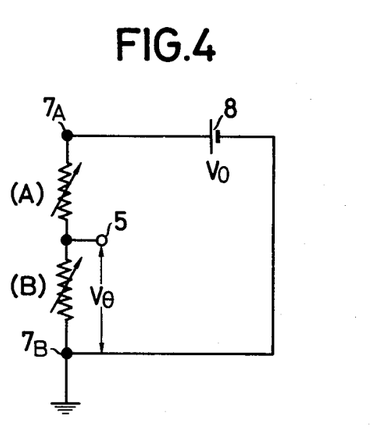
FIG. 4 is a circuit diagram equivalent to FIG. 1.

FIG. 4 shows a circuit equivalent to FIG. 1. Since the resistances of the ferromagnetic stripes (A) and (B) vary with the direction of the magnetic field H, the ferromagnetic stripes (A) and (B) can be regarded as variable resistors.

Figure 5:
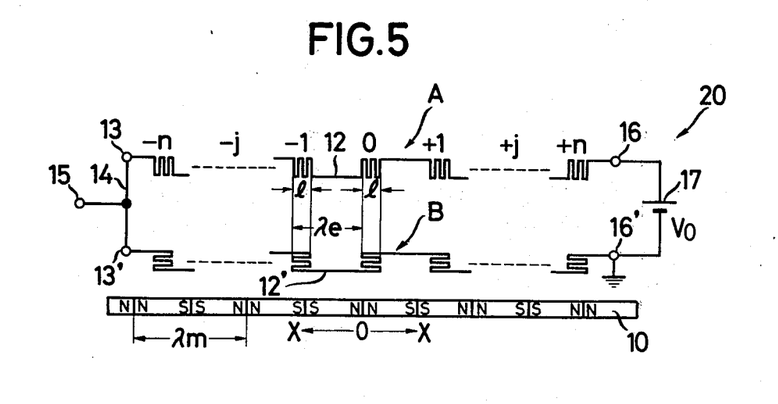
FIG. 5 is a schematic view of a multiple magnetoresistance element according to one embodiment of this invention.

Next, one embodiment of this invention will be described with reference to the drawings. Referring to FIG. 5, repeated magnetic signals 10 are recorded on a magnetic recording medium at a wave length $\lambda m$. Magnetic fields from the repeated magnetic signals 10 are so intensive as to saturate a multiple magnetoresistance element 20. A first stripe groups A comprises a plurality of stripes of the type (A) shown on FIG. 1 which are connected in series with each other by conductors 12. A second stripe group B comprises a plurality of stripes of the type (B) shown on FIG. 1 which are connected in series with each other by conductors 12'. The distance between the adjacent stripes is $\lambda e$ in the first stripe group A and the second stripe group B. Each stripe has the width of 1. The stripes are marked with $-n, \ldots, -j, \ldots, -1, 0, 1, \ldots +j, \ldots +n$. One terminal 13 of the first stripe group A is connected to one terminal 13' of the second stripe group B by a conductor 14. An output terminal 15 is connected to the conductor 14. A power source 17 is connected betweeen other terminals 16 and 16' of the first stripe group A and the second stripe group B. The terminal 16' is connected to the ground.

The first stripe group A and the second stripe group B are formed on both sides of a base plate made of glass in such a manner that the two stripes denoted by the same reference mark are opposed to each other through the base plate. They may be formed one above another on one side of the base plate in such a manner that the two stripes denoted by the same reference mark are opposed to each other through an insulating layer.

Figure 6:
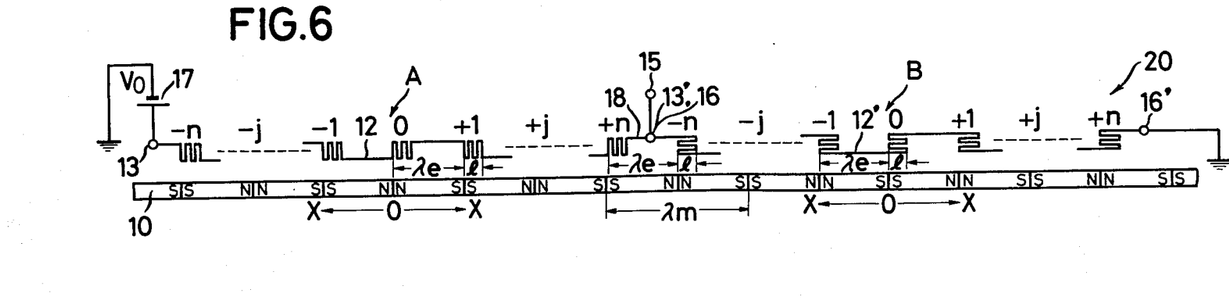
FIG. 6 is a schematic view of a multiple magnetoresistance element according to another embodiment of this invention.

FIG. 6 shows another embodiment of this invention.

In this embodiment, the first stripe group A and the second stripe group B are formed on the one side of the base plate. The terminals 13' and 16 are connected to each other by a conductor 18. The output terminal 15 is connected to the conductor 18. The terminal 13 is connected to the power source 17. The terminal 16' is connected to the ground. The distance between the $+n$-th stripe of the first stripe group A and the $-n$-th stripe group B is $\lambda e$. Similarly, the distance between the other adjacent stripes is $\lambda e$ in the first stripe group A and the second stripe group B. If the repeated magnetic signals 10 are fixed and the distance $\lambda e$ varies, the output voltage from the output terminal 15 varies as shown on FIG. 7 which is maximum at $\lambda e = (\lambda m/2)k$ ($k=1,2,3 \ldots$), where the multiple magnetoresistance element 20 can have the selectivity of wave length.

Next, the selectivity of wave length will be mathmatically analyzed.

On the assumption that only the magnetic fields from the two adjacent magnets corresponding to one wave length act on each stripe ($0 \sim \pm j \sim \pm n$), composite magnetic fields are calculated for each stripe. The electrical resistance of each stripe is obtained from the equations (1) and (2) relating to the direction of the composite magnetic field. The whole resistances $\rho_{AO}$ and $\rho_{BO}$ of the first stripe group A and the second stripe group B are represented by $$\rho_{AO} = (2n+1)\rho_o + \frac{\Delta\rho}{2} \cdot \frac{\sin 2\pi l/\lambda m}{2\pi l/\lambda m}$$

$$\left(\cos \frac{4\pi}{\lambda m} x + \frac{2\pi}{\lambda m}1\right) \cdot \left[1 + 2 \sum_{j=1}^{n} \cos \frac{4\pi}{\lambda m}\lambda e j\right] \tag{6}$$

$$\rho_{BO} = (2n+1)\rho_o - \frac{\Delta\rho}{2} \cdot \frac{\sin 2\pi l/\lambda m}{2\pi l/\lambda m}$$

$$\left[ 1 + 2\cos\frac{2\pi(n+1)\lambda e}{\lambda m} \cdot \frac{\sin 2\pi n\lambda e/\lambda m}{\sin 2\pi\lambda e/\lambda m} \right]$$

$$\left( \cos\frac{4\pi}{\lambda m}x + \frac{2\pi}{\lambda m}l \right) \quad (7)$$

, where $x$ represents a displacement from the position shown on FIG. 6. From the equations (3), (6) and (7), the output voltage $V\theta_0$ is represented by $$V_{\theta\ 0} = \frac{\rho_{BO}V_o}{\rho_{AO} + \rho_{BO}} = \underbrace{\frac{V_o}{2}}_{(a)} - \underbrace{\frac{\Delta\rho}{4(2n+1)\rho_o}}_{} V_o \cdot \underbrace{\frac{\sin 2\pi l/\lambda m}{2\pi l/\lambda m}}_{(b)}$$

$$\underbrace{\left[ 1 + 2\cos 2\pi(n+1)\lambda e/\lambda m \cdot \frac{\sin 2\pi n\lambda e/\lambda m}{\sin 2\pi\lambda e/\lambda m} \right]}_{(c)} \cdot \underbrace{\cos(4\pi x/\lambda m + 2\pi l/\lambda m)}_{(d)} \quad (8)$$

, where the first term represents a standard voltage and the second term the change of the output voltage. In the second term, the term $(a)$ is a constant depending on the property of the stripe, the term $(b)$ is a loss factor due to the width $l$ of the stripe, the term $(c)$ represents the selectivity of wave length and the term $(d)$ represents the change of the amplitude of the output voltage.

The term $(c)$ is represented by $W_s$, $$W_s = 1 + 2\cos 2\pi(n+1)\lambda e/\lambda m \cdot \frac{\sin 2\pi n\lambda e/\lambda m}{\sin 2\pi\lambda e/\lambda m} \quad (9)$$

The case that $W_s$ is maximum, will be considered.

The term, $\cos 2\pi(n+1)\lambda e/\lambda m$ is maximum or minimum, independent on the value of $n$, when $\lambda e/\lambda m$ is integral-number times as large as ½. If $\lambda e/\lambda m = \frac{1}{2}k(k=1,2,3 \ldots)$, $$\cos 2\pi(n+1)\lambda e/\lambda m = \cos\pi(n+1)\ k = \pm 1 \quad (10)$$

, where $+1$ when $k=$an even number, or when $k=$an odd number and $n=$an odd number, and $-1$ when $k=$an odd number and $n=$an even number.

Next, the term, $\sin 2\pi n\ \lambda e/\lambda m / \sin 2\pi\lambda e/\lambda m$ is indefinite at $\lambda e/\lambda m = \frac{1}{2}k$. If $\lambda e/\lambda m = \frac{1}{2}k \pm \epsilon$, the limit, as $\epsilon$ approaches zero, is $$\lim_{\epsilon \to 0} \frac{\sin(\pi nk \pm 2\pi n\epsilon)}{\sin(\pi k \pm 2\pi\epsilon)} =$$

$$\frac{\sin\pi nk \cdot \cos 2\pi n\epsilon \pm \cos\pi nk \cdot \sin 2\pi n\epsilon}{\sin\pi k \cdot \cos 2\pi\epsilon \pm \cos\pi k \cdot \sin 2\pi\epsilon} = \pm n \quad (11)$$

,where $+n$ when $k=$an even number, or when $k=$an odd number and $n=$an odd number, and $-n$ when $k=$an odd number and $n=$an even number. Accordingly, the term, $\sin 2\pi n\lambda e/\lambda m / \sin 2\pi\lambda e/\lambda m$ is maximum or minimum at $\lambda e/\lambda m = \frac{1}{2}k$.

Consequently, $W_s$ is maximum at $\lambda e/\lambda m = \frac{1}{2}k$. If the results of the equations (10) and (11) are substituted for the equation (9), $$W_s\ \text{max} = 2n + 1 \quad (12)$$

is obtained for $n$ and $k=$ an even number or an odd number.

Figure 7:
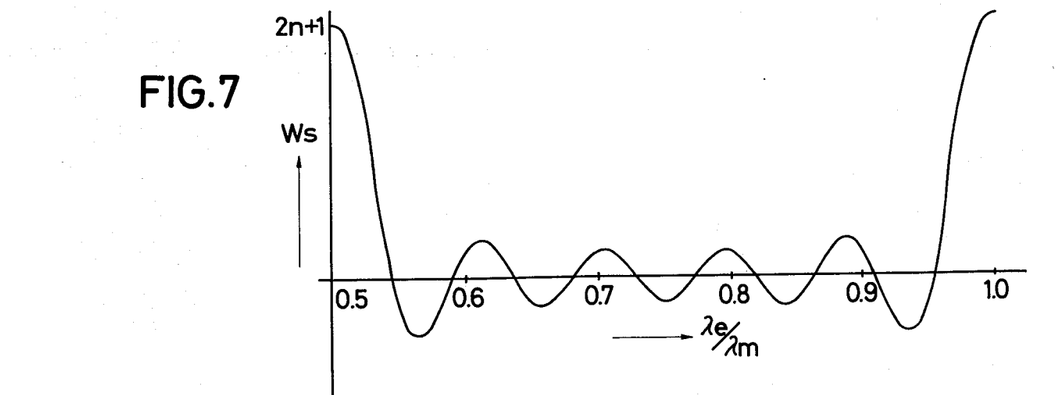
FIG. 7 is a graph showing a characteristic of selectivity of wave length for a multiple magnetoresistance element according to this invention.

FIG. 7 shows the characteristics of the selectivity of wave length for $n=5$ and the range, $0.5 \leq \lambda e/\lambda m \leq 1$.

Next, the selectivity of wave length will be described with reference to FIG. 8.

Figure 8:
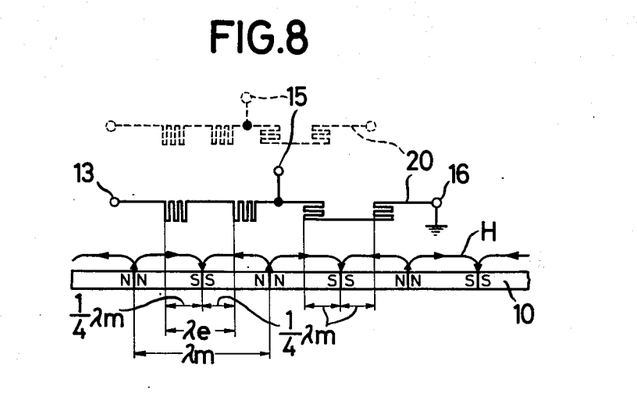
FIG. 8 shows the relationship between the multiple magnetoresistance element according to the other embodiment of this invention and repeated magnetic signals.

FIG. 8 shows the relationship between the multiple magnetoresistance element 20 and the magnetic fluxes from the repeated magnetic signals 10. Each stripe group comprises two stripes. The distance between the two adjacent stripes is $\lambda e = \frac{1}{2}\lambda m(k=1)$, as shown by the solid line on FIG. 8. The magnetic fields H are applied to the multiple magnetoresistance element 20 at angles 90° and 270°. The maximum output is obtained from the output terminal 15, as apparent from FIG. 3. If the distance between the two adjacent stripes is different as shown by the dotted line on FIG. 8, the magnetic fields H are applied to the multiple magnetoresistance element 20 at angles deflecting from 90° and 270°. The output is reduced. It is understood that the magnetoresistance element 20 can have the selectivity of wave length at $\lambda e/\lambda m = \frac{1}{2}(k=1)$. Of course, the magnetoresistance element 20 can have the selectivity of wave length at $\lambda e/\lambda m\ k(k=2,3,4 \ldots)$.

Figure 9:
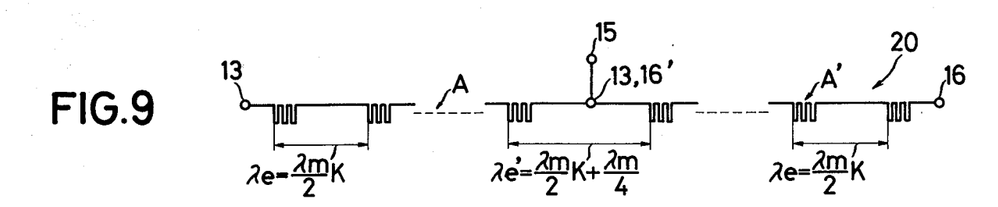
FIG. 9 and FIG. 10 are schematic views of multiple magnetoresistance elements according to further embodiments of this invention.
Figure 10:
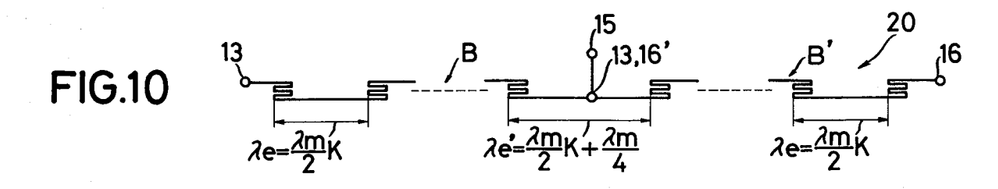

FIG. 9 and FIG. 10 show further embodiments of this invention. Only the stripes of the type (A) shown on FIG. 1 are used in the embodiment of FIG. 9. And only the stripes of the type (B) shown on FIG. 1 are used in the embodiment of FIG. 10. The distance $\lambda e'$ between the first stripe group A (B) and the second stripe group A'(B') is equal to $$\left( \frac{\lambda m}{2}k + \frac{\lambda m}{4} \right).$$

Figure 11:
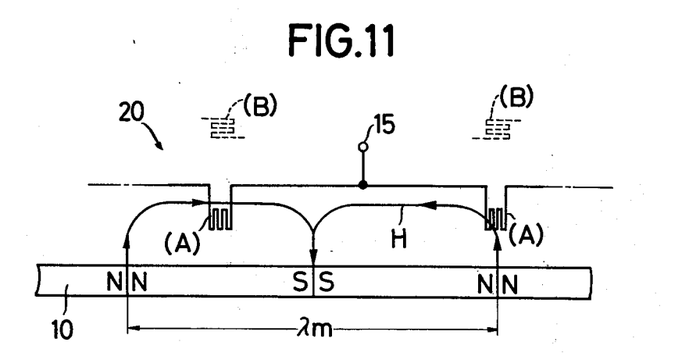
FIG. 11 shows the relationship between the multiple magnetoresistance elements according to the further embodiments of this invention and the repeated magnetic signals.

The distance $\lambda e$ between the two adjacent stripes is equal to $(\lambda m/2)k$ in the first stripe group A (B) and the second stripe group A'(B'). FIG. 11 shows the relationship between the multiple magnetoresistance element of FIG. 9 or FIG. 10 and the magnetic field from the magnetic signals 10. The magnetic fields H are applied to the first stripe group A (B) at the angles 90° and 270° and to the second stripe group A' (B') at the angles 0° and 180°. That effect is equivalent to the effect of the fact that the magnetic fields H are applied to the first stripe group and the second stripe group at the angles 90° and 270° in FIG. 8. Accordingly, the multiple magnetoresistance elements 20 of FIG. 9 and FIG. 10 can have the selectivity of wave length.

Figure 12:
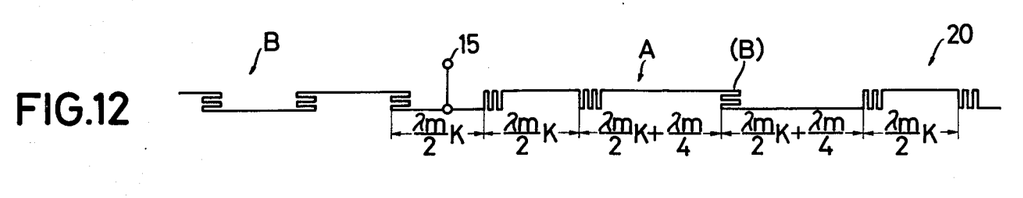
FIG. 12 is a schematic view of a multiple magnetoresistance element according to a still further embodiment of this invention.

FIG. 12 shows a still further embodiment of this invention.

A stripe of the type (B) is connected in the stripe group A. The distances between the stripe of the type (B) and the next stripes of the type (A) are equal to $$\left(\frac{\lambda m}{2}k + \frac{\lambda m}{4}\right).$$

The distance between the stripes at the both sides of the connecting point between the first stripe group and the second stripe group is equal to $$\left(\frac{\lambda m}{2}k + \frac{\lambda m}{4}\right),$$

where the stripes are of the same type. And it is equal to $(\lambda m/2)k$, where the stripes are of the different types. For example, the repeated magnetic signals are recorded on the periphery of a turn table for the speed control. Or the repeated magnetic signals are used for the graduation of the magnetic scale. It is generally difficult to record the repeated magnetic signals on any magnetic medium at an exact wave length. For that reason, the frequency of the recorded magnetic signals is not constant.

Since the multiple magnetoresistance element according to this invention has the selectivity of wave length, the length of plural waves can be detected by the multiple magnetoresistance element.

The magnetoresistance element is used in the saturation magnetic field. Accordingly, it is not affected by the external magnetic field. Although the resistance of the magnetoresistance element varies with temperature, the changes of $\Delta\rho$ and $\rho_o$ are very little, since $\rho_{//}$ and $\rho_\perp$ in the equation (4) are simultaneously changed with temperature. Consequently, the output voltage is not affected by temperature.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined in the appended claims.

What is claimed is:

1. A multiple magnetoresistance element comprising:
   a. first and second magnetoresistance stripe groups aligned in different directions formed of ferromagnetic material having an anistropic effect of magnetoresistance, connected electrically in series with each other and spaced from each other by a predetermined distance, said first and second magnetoresistance stripe groups comprising a plurality of magnetoresistance stripes having main current path portions, connected electrically in series with each other and spaced from each other by a predetermined distance;
   b. an output terminal connected to a connecting point of said first and second magnetoresistance stripe groups;
   c. current supply terminals connected to ends of said first and second magnetoresistance stripe groups; and
   d. a power source connected to said current supply terminals.

2. A multiple magnetoresistance element comprising:
   a. first and second magnetoresistance stripe groups formed of ferromagnetic material having an anistropic effect of magnetoresistance, connected electrically in series with each other and spaced from each other by a predetermined distance, said first and second magnetoresistance stripe groups comprising a plurality of magnetoresistance stripes having main current path portions, connected electrically in series with each other and spaced from each other by a predetermined distance;
   b. an output terminal connected to a connecting point of said first and second magnetoresistance stripe groups;
   c. current supply terminals connected to ends of said first and second magnetoresistance stripe groups;
   d. a power source connected to said current supply terminals, and wherein the distance $\lambda e$ between said first and second magnetoresistance stripe groups is equal to $\lambda m/2k$, where $\lambda m$ represents a wave length of periodic magnetic signals and $k = 1, 2, 3 \ldots$.

3. A multiple magnetoresistance element according to claim 2, wherein the direction of said main current path portions of said first magnetoresistance stripe group is perpendicular to the direction of said main current path portions of said second magnetoresistance stripe group, and the distance between the two adjacent magnetoresistance stripes is $\lambda e(=[\lambda m/2]k)$ in said first and second magnetoresistance stripe groups.

4. A multiple magnetoresistance element comprising:
   a. first and second magnetoresistance stripe groups formed of ferromagnetic material having an anistropic effect of magnetoresistance, connected electrically in series with each other and spaced from each other by a predetermined distance, said first and second magnetoresistance stripe groups comprising a plurality of magnetoresistance stripes having main current path portions, connected electrically in series with each other and spaced from each other by a predetermined distance;
   b. an output terminal connected to a connecting point of said first and second magnetoresistance stripe groups;
   c. current supply terminals connected to ends of said first and second magnetoresistance stripe groups;
   d. a power source connected to said current supply terminals, and wherein the distance $\lambda e$ between said first and second magnetoresistance stripe groups is equal to $$\left(\frac{\lambda m}{2}k + \frac{\lambda m}{4}\right).$$

5. A multiple magnetoresistance element according to claim 4, wherein the direction of said main current path portions of said first magnetoresistance stripe group is parallel with the direction of said main current path portions of said second magnetoresistance stripe group, and the distance between the two adjacent magnetoresistance stripes is $\lambda e\ (=[\lambda m/2]k)$ in said first and second magnetoresistance stripe groups.

6. A multiple magnetoresistance element comprising:
   a. first and second magnetoresistance stripe groups formed of ferromagnetic material having an anistropic effect of magnetoresistance, connected electrically in series with each other and spaced from each other by a predetermined distance, said first and second magnetoresistance stripe groups comprising a plurality of magnetoresistance stripes having main current path portions, connected electrically in series with each other and spaced from each other by a predetermined distance;

b. an output terminal connected to a connecting point of said first and second magnetoresistance stripe groups;

c. current supply terminals connected to ends of said first and second magnetoresistance stripe groups;

d. a power source connected to said current supply terminals, and wherein different magnetoresistance stripes having main current path portions the direction of which is perpendicular to the direction of the main current path portions of other magnetoresistance stripes are connected in said first magnetoresistance group and the distances $\lambda \ell'$ between said different magnetoresistance stripes and said other magnetoresistance stripes before and behind said different magnetoresistance stripe being equal to $$\left(\frac{\lambda m}{2} k + \frac{\lambda m}{4}\right).$$

7. A multiple magnetoresistance element comprising
a. first and second magnetoresistance stripe groups formed of ferromagnetic material having an anistropic effect of magnetoresistance, connected electrically in series with each other and spaced from each other by a predetermined distance, said first and second magnetoresistance stripe groups comprising a plurality of magnetoresistance stripes having main current path portions, connected electrically in series with each other and spaced from each other by a predetermined distance;

b. an output terminal connected to a connecting point of said first and second magnetoresistance stripe groups;

c. current supply terminals connected to ends of said first and second magnetoresistance stripe groups;

d. a power source connected to said current supply terminals, and wherein a different magnetoresistance stripe having main current path portions the direction of which is perpendicular to the direction of the main current path portions of other magnetoresistance stripes, is connected in said first magnetoresistance group, the distances $\lambda \ell''$ between said different magnetoresistance stripe and said other magnetoresistance stripes before and behind said different magnetoresistance stripe being equal to $$\left(\frac{\lambda m}{2} k + \frac{\lambda m}{4}\right).$$

* * * * *